United States Patent
Yano

(10) Patent No.: US 11,828,782 B2
(45) Date of Patent: Nov. 28, 2023

(54) ELECTRIC FIELD MEASURING DEVICE AND ELECTRIC FIELD MEASURING METHOD

(71) Applicant: Hitachi, Ltd., Tokyo (JP)

(72) Inventor: Tomohiko Yano, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 82 days.

(21) Appl. No.: 17/738,138

(22) Filed: May 6, 2022

(65) Prior Publication Data

US 2022/0397614 A1   Dec. 15, 2022

(30) Foreign Application Priority Data

Jun. 9, 2021 (JP) ................................ 2021-096957

(51) Int. Cl.

| | |
|---|---|
| *G01R 29/12* | (2006.01) |
| *G01R 27/26* | (2006.01) |
| *G01R 31/40* | (2020.01) |
| *G01R 15/14* | (2006.01) |
| *G01R 15/16* | (2006.01) |
| *H03F 1/08* | (2006.01) |
| *H03F 1/26* | (2006.01) |

(52) U.S. Cl.
CPC ........... *G01R 29/12* (2013.01); *G01R 15/148* (2013.01); *G01R 15/165* (2013.01); *G01R 27/2605* (2013.01); *G01R 31/40* (2013.01); *H03F 1/08* (2013.01); *H03F 1/26* (2013.01)

(58) Field of Classification Search
CPC .... G01R 29/12; G01R 15/148; G01R 15/165; G01R 27/2605; G01R 31/40; H03F 1/08; H03F 1/26
See application file for complete search history.

(56) References Cited

U.S. PATENT DOCUMENTS

2002/0109545 A1 * 8/2002 Krupka ..................... H03F 1/56
                                                              330/11
2004/0070446 A1   4/2004 Krupka

FOREIGN PATENT DOCUMENTS

JP        2007-502423 A    2/2007

* cited by examiner

*Primary Examiner* — Amy He
(74) *Attorney, Agent, or Firm* — Crowell & Moring LLP

(57) ABSTRACT

An electric field measuring device measures an electric field corresponding to an inter-electrode voltage between two electrodes, based on a voltage signal that arises at an electric field antenna including the two electrodes because of the electric field. The electric field measuring device includes an amplifier, a reference capacitive element, a GPIO that generates a step wave, and a microcomputer that processes a voltage signal. The microcomputer inputs the step wave to the amplifier, using the GPIO, obtains a step response waveform, and obtains an amplitude compensation factor, based on the step response waveform. The microcomputer compensates the voltage signal, using the amplitude compensation factor.

10 Claims, 8 Drawing Sheets

FIG. 2

$$V_{100} = \frac{C_1}{C_1 + C_{222} + C_{230}} V_0 \qquad \cdots (1)$$

$$V_A = \frac{C_{230}}{C_{222} + C_{230}} V_{STEP} \qquad \cdots (2)$$

$$\tau = R_S \frac{C_1(C_{222} + C_{230})}{C_1 + C_{222} + C_{230}} \qquad \cdots (3)$$

$$V_B = \frac{C_{230}}{C_1 + C_{222} + C_{230}} V_{STEP} \qquad \cdots (4)$$

$$V_{100} = \left(1 - \frac{V_B}{V_A}\right) V_0 \qquad \cdots (5-1)$$

$$V_0 = \left(\frac{V_A}{V_A - V_B}\right) V_{100} \qquad \cdots (5-2)$$

$$k = \frac{V_A}{V_A - V_B} \qquad \cdots (6)$$

FIG. 7

$$V_{100} = \frac{C_1}{C_1 + C_{222} + (1-G)C_{230}} V_0 \quad \cdots (7)$$

$$V_{100} = \frac{V_{STEP}(V_A - V_B)}{V_{STEP}V_A - GV_AV_B} V_0 \quad \cdots (8)$$

$$k = \frac{V_A}{V_A - V_B} - \frac{GV_AV_B}{V_{STEP}(V_A - V_B)} \quad \cdots (9)$$

ELECTRIC FIELD MEASURING DEVICE AND ELECTRIC FIELD MEASURING METHOD

BACKGROUND OF THE INVENTION

1. Field of the Invention

The present invention relates to an electric field measuring device and an electric field measuring method for measuring an electric field in space. More specifically, the present invention relates to an electric field measuring device and an electric field measuring method for measuring an electric field caused by a commercial power supply.

2. Description of the Related Art

Electric fields flying in free space include a radio-frequency electric field caused by wireless device for wireless communication and a low-frequency electric field caused by a commercial power supply, such as a low-frequency electric field caused by an electric device or a power transmission line.

An electric field caused by a commercial power supply is generated in free space around an electric device or a power transmission line only when the electric device or power transmission line carries current. Such an electric field caused by a commercial power supply is not generated when the electric device or power transmission line carries no current.

In a case where an electric device carries current, when the electric device fails to cause a current leak and a part supposed not to be charged is charged because of the current leak, an electric field in free space around the electric device changes to become different from an electric field in a normal condition. Therefore, by monitoring (measuring) an electric field in free space around the electric device, the presence or absence of a current flow and of a current leak can be confirmed. Monitoring (measuring) the electric field in free space around the electric device thus serves as a useful means by which, for example, an electric shock accident is prevented.

To measure an electric field caused by a commercial power supply, an electric field antenna is used. An electric field antenna is typically composed of two electrode plates that are separated from and counter to each other. An electric field between the electrode plates is detected as a voltage that arises between the electrode plates.

When the voltage is read from outside the electric field antenna, the output impedance of the electric field antenna is determined by an extremely small capacitance (e.g., 20 pF) between the electrode plates. The output impedance is, therefore, high. Therefore, reading the voltage from this electric field antenna showing a minute capacitance value requires a reading circuit with high input impedance.

As a reading circuit for such an electric field antenna, JP 2007-502423 A discloses a reading circuit configured to supply a bias current to an amplifier at the first stage of the reading circuit, using a feedback circuit.

This reading circuit can increase its impedance, thus allowing efficient reading of the voltage from the electric field antenna. A method of increasing the input impedance of the reading circuit is a method of giving frequency characteristics to the impedance of the feedback circuit connected in parallel to an amplifier input. Specifically, the impedance of the feedback circuit is set high at a signal frequency and is set low for direct current (DC). As a result, while the bias current is steadily supplied to the amplifier, the amplifier appears to have high impedance when seen from the electric field antenna.

SUMMARY OF THE INVENTION

However, in the reading circuit of JP 2007-502423 A, a parasitic input capacitance component is generated in the amplifier included in the reading circuit. This parasitic input capacitance component (input capacitance) is also connected in parallel to the amplifier input. A drop in the input impedance of the reading circuit caused by this input capacitance, therefore, cannot be prevented.

In general, when the amplifier is composed of a semiconductor, for example, composed of a differential amplifier as a discrete component, the amplifier has an input capacitance of several pF, which is a capacitance size that cannot be neglected in relation to the output capacitance of the electric field antenna.

Because of this, when the electric field antenna is connected to the reading circuit, the amplitude of a voltage signal output from the electric field antenna attenuates, in which case the reading circuit of JP 2007-502423 A is incapable of highly sensitive reading of an electric field. The reading circuit of JP 2007-502423 A thus has a problem that the precision of electric field measurement drops.

The present invention has been conceived to deal with the above problem. An object of the present invention is to provide an electric field measuring device and an electric field measuring method that improve the precision of electric field measurement.

In order to solve the above problem, an electric field measuring device according to the present invention includes: an electric field detection unit that includes two electrodes and generates a voltage signal because of an electric field; an amplifier that receives input of the voltage signal via a series resistance, and buffers or amplifies the voltage signal to output the voltage signal; a reference capacitive element that has a reference capacitance, and has an output end connected between an output end of the series resistance and an input end of the amplifier; a step wave generating unit that is connected to an input end of the reference capacitive element, and generates a step wave; an analog-to-digital conversion unit that receives input of the voltage signal output from the amplifier, and converts the input voltage signal into a digital signal at a predetermined sampling period; and an information processing unit that processes the voltage signal that has been converted into the digital signal by the analog-to-digital conversion unit, in which the information processing unit, using the step wave generating unit, inputs the step wave to the amplifier through between the output end of the series resistance and the input end of the amplifier, via the reference capacitive element, and obtains a step response waveform that is a waveform indicating a step response of output from the amplifier when the step wave is input to the amplifier, calculates, based on the step response waveform, an amplitude compensation factor derived based on a relationship between an inter-electrode voltage between the two electrodes that arises because of the electric field, and a voltage indicated by the voltage signal, the reference capacitance, an input capacitance that is a parasitic capacitive element of the amplifier, and an inter-electrode capacitance that is a capacitance between the electrodes, and compensates the voltage signal output from the amplifier, using the amplitude compensation factor, and obtains the compensated voltage signal, as the electric field corresponding to the inter-electrode voltage.

An electric field measuring method according to the present invention includes: causing an electric field detection unit that includes two electrodes to generate a voltage signal because of an electric field; inputting the voltage signal to an amplifier via a series resistance and causing the amplifier to buffer or amplify the voltage signal to output the voltage signal; causing a step wave generating unit to generate a step wave, the step wave generating unit being connected to an input end of a reference capacitive element that has a reference capacitance and has an output end connected between an output end of the series resistance and an input end of the amplifier; converting the voltage signal output from the amplifier, into a digital signal at a predetermined sampling period; and processing the voltage signal that has been converted into the digital signal, the method further including: inputting the step wave to the amplifier through between the output end of the series resistance and the input end of the amplifier, via the reference capacitive element; obtaining a step response waveform that is a waveform indicating a step response of output from the amplifier when the step wave is input to the amplifier; calculating, based on the step response waveform, an amplitude compensation factor derived based on a relationship between an inter-electrode voltage between the two electrodes that arises because of the electric field, and a voltage indicated by the voltage signal, the reference capacitance, an input capacitance that is a parasitic capacitive element of the amplifier, and an inter-electrode capacitance that is a capacitance between the electrodes; and compensating the voltage signal output from the amplifier, using the amplitude compensation factor, and obtaining the compensated voltage signal, as the electric field corresponding to the inter-electrode voltage.

The present invention improves the precision of electric field measurement.

BRIEF DESCRIPTION OF THE DRAWINGS

FIG. 2 is a diagram illustrating numerical formulae used to describe a method of calculating an amplitude compensation factor;

FIG. 7 is a diagram illustrating numerical formulae used to describe a method of calculating an amplitude compensation factor.

DESCRIPTION OF THE PREFERRED EMBODIMENTS

Figure 1:
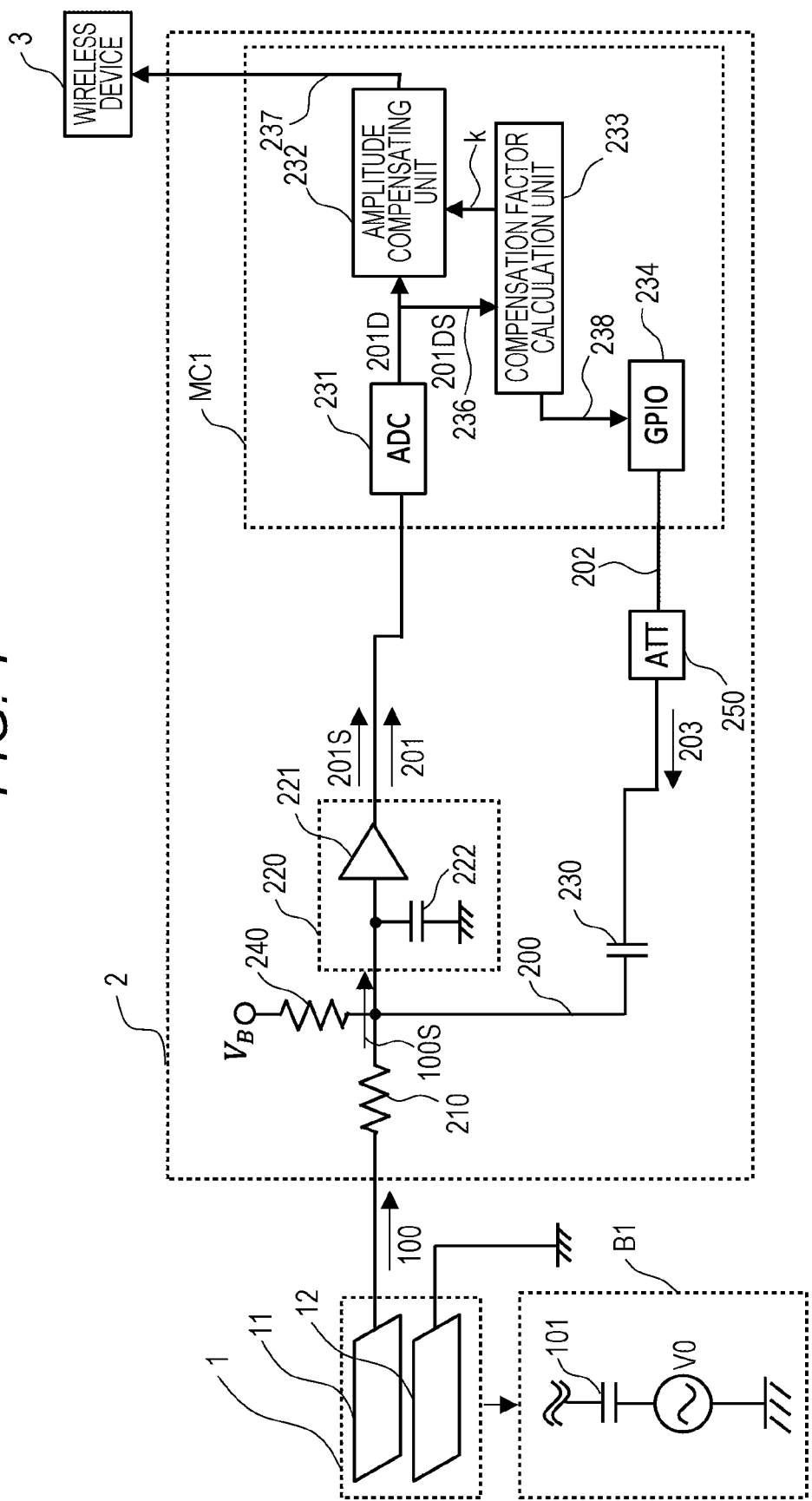
FIG. 1 is a schematic configuration diagram of an electric field measuring device according to a first embodiment of the present invention.

<<Details of Related Art and Overview of the Present Invention>>

To facilitate understanding of the present invention, details of related art and an overview of the present invention will first be described. As described above, for example, JP 2007-502423 A discloses a reading circuit for an electric field antenna. JP 2007-502423 A discloses a configuration of the reading circuit in which a bias current is supplied to an amplifier at a first stage of the reading circuit, using a feedback circuit. This configuration increases the impedance of the reading circuit, allowing efficient reading of a voltage from an electric field antenna.

A method of increasing the input impedance of the reading circuit in JP 2007-502423 A is a method of giving frequency characteristics to the impedance of the feedback circuit connected in parallel to the amplifier input. Specifically, according to the reading circuit in JP 2007-502423 A, the impedance is set high at a signal frequency and is set low for DC. As a result, according to the reading circuit in JP 2007-502423 A, while the bias current is steadily supplied to the amplifier, the amplifier appears to have high impedance when seen from the electric field antenna. However, in this configuration, a parasitic input capacitance component (input capacitance) is also connected in parallel to the amplifier input. A drop in the input impedance of the reading circuit caused by this input capacitance, therefore, cannot be prevented. In general, when the amplifier is composed of a semiconductor, for example, composed of a differential amplifier as a discrete component, the amplifier has an input capacitance of several pF, which is a capacitance size that cannot be neglected in relation to the output capacitance of the electric field antenna. As a result, when the electric field antenna is connected to the reading circuit, a signal amplitude attenuates, thus making highly sensitive electric field reading impossible. JP 2007-502423 A discloses also a configuration in which the feedback circuit provides positive feedback, rendering the impedance of the feedback circuit seen from the electric field antenna a negative capacitance, which cancels out the input capacitance of the amplifier. In this configuration, however, too much input capacitance of the amplifier is canceled out by the negative capacitance. If the sum of both capacitances ends up in negative, it makes the circuit unstable, leading to its oscillation, which is a problem. It is, for this reason, necessary that the amount of capacitance to be canceled out be smaller than the input capacitance of the amplifier. In this configuration, therefore, the input capacitance cannot be canceled out completely. In addition, in the case of an amplifier composed of a semiconductor, its input capacitance value may vary widely, depending on manufacturing processes. When circuits including such amplifiers are mass-produced, therefore, the amount of input capacitance to be canceled out needs to be determined separately for each circuit, which increases manufacturing costs. Variations in input capacitance affect connection between the electric field antenna and the reading circuit as well, leading to a case where a total gain in conversion from an electric field to a voltage at the electric field antenna and reading circuit varies in each circuit. This creates a problem of errors in electric field measurements. The present invention has been conceived in view of the above problems. An object of the present invention is to provide an electric field measuring device that improves the precision of electric field measurement by properly compensating a voltage signal (which may also be referred to as an "electric field signal") generated by an electric field antenna, the voltage signal having its amplitude attenuated by the input capacitance (parasitic capacitive element) of an amplifier included in a reading circuit.

Embodiments of the present invention will hereinafter be described in detail with reference to the drawings.

First Embodiment

<Configuration>

An electric field measuring device according to a first embodiment of the present invention will be described. As shown in FIG. 1, the electric field measuring device according to the first embodiment of the present invention includes an electric field antenna 1, a reading circuit 2, and a wireless device 3.

The electric field antenna 1 is composed of two electrodes: an electrode plate 11 and an electrode plate 12 that are counter to and separated from each other. The electrode plate 11 and the electrode plate 12 receive an electric field in free space, generate a voltage signal 100 (electric field signal), which is an analog signal corresponding in size to the electric field, and output the voltage signal 100. The voltage signal 100 is input to the reading circuit 2 via a signal line.

The reading circuit 2 receives the voltage signal 100 output from the electric field antenna 1 having high output impedance, the reading circuit 2 having high input impedance against the incoming voltage signal 100, converts the voltage signal 100 as an analog signal into a digital signal 237, and outputs the digital signal 237 to the wireless device 3.

The reading circuit 2 includes a series resistance 210, an amplifier 220, and a microcomputer MC1 (hereinafter, "microcomputer MC1"). The reading circuit 2 further includes a reference capacitive element 230, a bias circuit 240, and an attenuator 250.

The amplifier 220 has high input impedance. The voltage signal 100 is input to the amplifier 220 from the electric field antenna 1 with high output impedance (electric field antenna 1 functioning as an electric field probe), via the series resistance 210. The amplifier 220 amplifies or buffers and outputs the voltage signal 100 (in this example, the amplifier 220 buffers and outputs the voltage signal 100).

The amplifier 220 may be provided as, for example, an FET input type operational amplifier with high input impedance. The amplifier 220 is supplied with an input bias current through the bias circuit 240. The bias circuit 240 may be a resistance with a large resistance value when the input bias current to the amplifier 220 is minute, or may be a feedback circuit with high impedance, as described in JP 2007-502423 A. In FIG. 1, to make description easier, the amplifier 220 is depicted as an equivalent circuit including an ideal amplifier 221 and a parasitic capacitive element 222.

The microcomputer MC1 is a microcomputer including a CPU, a ROM, a RAM, a readable/writable nonvolatile memory, and an interface I/F. The CPU executes instructions (programs, routines) stored in the ROM, thereby implementing various functions.

The microcomputer MC1 functions as an information processing unit that processes a voltage signal output from the amplifier 220, and includes an AD converter 231, an amplitude compensating unit 232, a compensation factor calculation unit 233, and a general-purpose input/output (GPIO) 234, which are functional blocks. The microcomputer MC1 may be provided as an element different from the microcomputer, such as a field-programmable gate array (FPGA) or other circuit element. The AD converter 231 may be not incorporated in the microcomputer MC1 but be disposed outside the microcomputer MC1.

A voltage signal 201, which is an analog signal output from the amplifier 220, is input to the AD converter 231. The AD converter 231 converts an analog signal into a digital signal, and functions as an "analog-to-digital conversion unit". The AD converter 231 converts the voltage signal 201 into a digital signal at a predetermined sampling frequency (sampling period), and outputs a voltage signal 201D, which is the voltage signal 201 having been converted into a digital signal.

The voltage signal 201D, which is output from the AD converter 231, is input to the amplitude compensating unit 232. The amplitude compensating unit 232 compensates the voltage signal 201D, using an amplitude compensation factor k, and supplies the digital signal 237, which is the compensated voltage signal 201D, to the wireless device 3. The amplitude compensation factor k will be described in detail later.

Through a GPIO 234, the compensation factor calculation unit 233 inputs a step wave at predetermined timing to a connection node between an output end of the series resistance 210 and an input end of the amplifier 220, via the reference capacitive element 230 having a reference capacitance C230. In this case, a voltage signal 100S created by superposing the step wave and voltage signal 100 (electric field signal) together is input to the amplifier 220, and the amplifier 220 outputs a voltage signal 201S. The voltage signal 201S includes a step response waveform (hereinafter, "step response waveform 236") of output from the amplifier 220. Hereinafter, to distinguish the voltage signal 201 not including the step response waveform 236 from the voltage signal 201S including the step response waveform, the voltage signal 201S will also be referred to, for convenience, as a "step response signal 201S".

The AD converter 231 converts the step response signal 201S into a digital signal at a predetermined sampling frequency, and outputs a step response signal 201DS, which is the step response signal 201S having been converted into a digital signal. The step response signal 201DS is input to the compensation factor calculation unit 233. The compensation factor calculation unit 233 calculates the above amplitude compensation factor k, based on the step response waveform 236 included in the step response signal 201DS. The compensation factor calculation unit 233 then outputs the calculated amplitude compensation factor k to the amplitude compensating unit 232. A method of calculating the amplitude compensation factor k will also be described in detail later.

The wireless device 3 transmits the digital signal 237, which is the voltage signal 201D having been compensated by the amplitude compensating unit 232, to a management server (not illustrated) located outside a voltage measuring device, through wireless communication. The management server acquires the incoming digital signal 237 as an electric field (an electric field corresponding to a voltage V0) between the electrode plate 11 and the electrode plate 12. The electric field measuring device may dispense with the wireless device 3.

The amplitude compensation factor k and a method of calculating the amplitude compensation factor k that is executed by the compensation factor calculation unit 233 will hereinafter be described in detail. As described above, in this example, the amplifier 220 functions as a buffer having an amplification factor of "1".

The amplifier 220 has a parasitic capacitive element that is not zero. As described above, in FIG. 1, the parasitic capacitive element of the amplifier 220 is indicated as "parasitic capacitive element 222". In addition, the ideal amplifier 221 is shown as an ideal amplifier having no parasitic capacitive element.

The voltage signal 100 generated by the electric field antenna 1 is attenuated in amplitude by the influence of the parasitic capacitive element 222 to have an amplitude smaller than the amplitude of the voltage V0 (which is referred to also as "output open circuit voltage V0 of the electric field antenna 1" or "signal source voltage V0") indicating the electric field (corresponding to the electric field) between the electrode plates 11 and 12 of the electric field antenna 1. As shown in a block B1 of FIG. 1, the electric field antenna 1 is expressed as an equivalent circuit composed of the voltage V0 and a capacitive element 101, and the voltage signal 100 is attenuated in amplitude to have an amplitude smaller than the amplitude of the voltage V0.

The magnitude of attenuation of the signal amplitude by the parasitic capacitive element 222 is determined by a ratio of the parasitic capacitive element 222 to the inter-electrode-plate capacitance of the electric field antenna 1. At the frequency (signal frequency) of a commercial power supply to be observed, a voltage V100 of the voltage signal 100 can be expressed as a divided portion of the voltage V0. A relationship between the voltage V0 ($V_0$) and the voltage V100 ($V_{100}$) thus can be expressed by formula (1) in FIG. 2. In formula (1), C1 ($C_1$) denotes the inter-electrode-plate capacitance of the electric field antenna 1 (the capacitance of the capacitive element 101), C222 ($C_{222}$) denotes the capacitance of the parasitic capacitive element 222, and C230 ($C_{230}$) denotes the capacitance of the reference capacitive element 230.

Formula (1) leads to understanding that when C222 varies because of irregularities in manufacturing of the amplifier 220, it causes a change in a gain of voltage reading from the electric field antenna 1, in which case precise electric field measurement cannot be made. It is now assumed that, at the signal frequency of the voltage signal 100, respective impedances of C1, C222, and C230 are set sufficiently smaller than the impedance of the bias circuit 240 and sufficiently larger than the impedance of the series resistance 210.

Attenuation of the voltage signal 100 (voltage V100) expressed by formula (1) can be compensated by signal processing if a relative value between "C1" and "C1+C222+C230" is known.

This relative value can be measured, based on an operating waveform from each component of the reading circuit 2 that is observed when the step wave is applied to an amplifier input 200 (a connection node between the input end of the amplifier 220 and the output end of the series resistance 210) via the reference capacitive element 230.

Hereinafter, a method of measuring the relative value between C1 and "C1+C222+C230", based on an operating waveform from each component that is observed when the step wave is applied will hereinafter be described with reference to FIG. 3.

Figure 3:
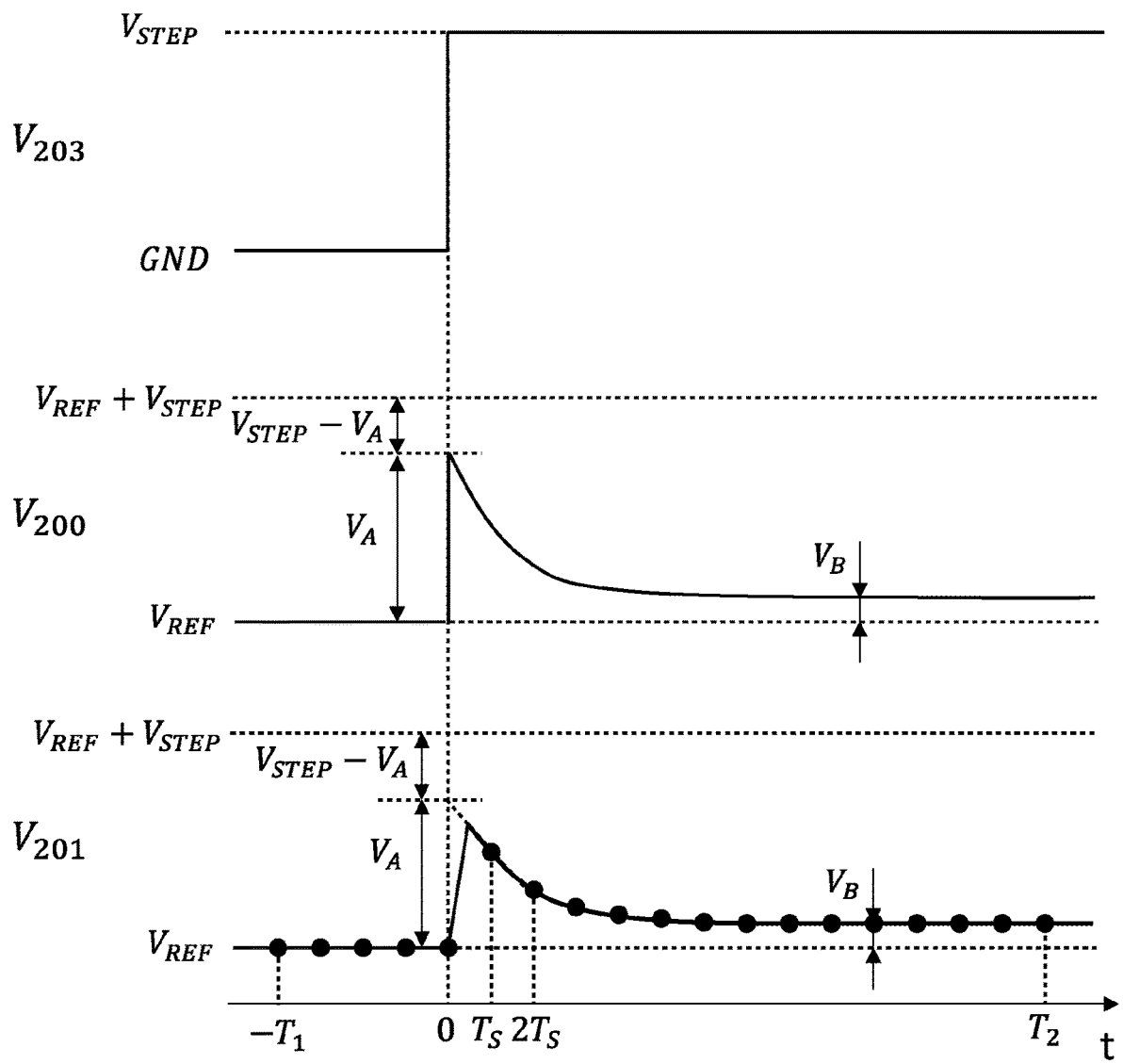
FIG. 3 is a diagram illustrating voltage waveforms when a relative value between capacitances is measured.

In FIG. 3, a voltage V203 represents the voltage of a voltage signal 203 that results after the step wave generated by the GPIO 234 is input to the attenuator 250. Because the GPIO 234 outputs only two values: a 0V (GND) level and a source voltage, the step wave is attenuated by the attenuator 250 to adjust the amplitude of the step wave to a proper amplitude. One reason for this attenuation is that the voltage of the amplifier input 200 needs to fall within an input voltage range of the amplifier 220. Another reason is that inputting a voltage with a greater amplitude to the amplifier 220 causes it to carry out large signal processing, which makes the amplifier 220 unstable in some cases. If attenuation for these reasons is unnecessary, the attenuator 250 may be omitted.

In FIG. 3, a voltage $V_{STEP}$ represents the amplitude of the step wave in the voltage signal 203. A voltage V200 represents the voltage of the amplifier input 200 that results when the step wave is input to the reference capacitive element 230.

As shown in FIG. 3, when the step wave (i.e., the voltage signal 203) is input to the reference capacitive element 230, the voltage V200 instantaneously rises stepwise at time t (=0), as indicated in a chart of the voltage V200. This is because that the step wave is divided in voltage by the reference capacitive element 230 and the parasitic capacitive element 222. Therefore, a first peak value VA ($V_A$) representing the wave height of the voltage V200 can be expressed by formula (2) in FIG. 2.

Thereafter, as a result of charge redistribution with the inter-electrode-plate capacitance of the electric field antenna 1 via the series resistance 210, the voltage V200 reduces in wave height at a primary RC response. The time constant τ of the RC response is determined by formula (3) in FIG. 2. In formula (3), Rs denotes the resistance value of the series resistance 210.

At a point of time of elapse of 5τ from a point of time of inputting the step wave (t=0), charge redistribution is completed 99% or more, and the voltage of the amplifier input 200 reaches a steady state. When the wave height (amplitude) at this point of time is denoted as a secondary peak value VB, the second peak value VB ($V_B$) is expressed by formula (4) in FIG. 2.

Now, using formulae (2) and (4), formula (1) can be expressed in terms of the first peak value VA and the second peak value VB, as formula (5-1) in FIG. 2. Formula (5-1) in FIG. 2 can be transformed into formula (5-2) in FIG. 2.

This means that when the first peak value VA and the second peak value VB are measured, substituting the measured first peak value VA and second peak value VB in formula (5-2) allows calculation of the true signal source voltage V0 from the attenuated voltage V100. The compensation factor calculation unit 233 determines the amplitude compensation factor k, which is given by formula (6) in FIG. 2, by substituting the measured first peak value VA and second peak value VB in formula (6). In other words, the compensation factor calculation unit 233 calculates the amplitude compensation factor k by dividing the first peak value VA by a difference given by subtracting the second peak value VB from the first peak value VA. The amplitude compensating unit 232 then multiplies the voltage signal 201D, which is a digital signal, by the amplitude compensation factor k, thereby obtaining the true signal source voltage waveform (digital signal 237) that is not under the influence of the parasitic capacitive element 222.

The microcomputer MC1 measures the first peak value VA and the second peak value VB of the voltage V200 by obtaining output from the amplifier 220 that results when the microcomputer MC1 inputs the step wave to the amplifier 220, via the AD converter 231 of the microcomputer MC1.

When the microcomputer MC1 inputs the step wave, a voltage V201 of the step response waveform included in the step response signal 201S output from the amplifier 220 is distorted in wave height because the response time is finite, as shown in FIG. 3. In addition, the sampling rate (sampling frequency) of the AD converter 231 (AD conversion) is also finite. Directly observing the first peak value VA (wave height), which is an instantaneous value, is therefore difficult. For this reason, the microcomputer MC1 estimates the first peak value VA of input to the amplifier 220 (amplifier input 200) at the point of time of inputting the step wave, based on the step response waveform (RC response waveform) of the voltage V201 sampled by the AD converter 231 in a sampling period Ts, thereby obtaining the first peak value VA. Specifically, the microcomputer MC1 extrapolates the RC response waveform of the voltage V201 with an exponential function and reads a voltage value indicating the first peak value VA at the point of time of inputting the step wave (estimated value VA of V201 at time t0 in FIG. 3), thereby obtaining the first peak value VA.

To execute this extrapolation of sampling points more properly, the sampling period Ts should preferably be shorter than, for example, the time constant τ of formula (3) (in other words, the time constant τ of formula (3) should preferably be longer than the sampling period Ts). Here is an example including specific numerical values: when C1=20 pF, C222=4 pF, and C230=3 pF and the sampling frequency of the AD converter 231 is 100 kHz, which is the standard sampling frequency of the microcomputer, Rs is should preferably be 1.9 MΩ or more.

When a plurality of sampling points are needed in the period of the time constant τ in order to measure the first peak value VA with high precision, Rs should preferably be further increased. It is more preferable, however, that the value of Rs be set sufficiently smaller than the impedance of the bias circuit 240. This is to prevent a case where charge redistribution via the series resistance 210 settles down and charges are released through the bias circuit 240 before the second peak value VB is measured.

The above electric field measuring device that carries out electric field measurement, using the amplitude compensation factor k, can obtain the amplitude compensation factor k in advance before carrying out an actual operation of electric field measurement. However, in a situation where electric field measurement lasts for a long period or environmental conditions, such as temperature conditions, change drastically, the values of C222 and C1 may change, depending on deposition of dirt, deterioration of the semiconductor, and temperature characteristics.

In such a case, it is preferable that the electric field measuring device make capacitance measurement (calculation of the amplitude compensation factor k) during the actual operation. In this case, however, the electric field signal waveform superimposed on the step response may become an obstacle to measurement of the first peak value VA and the second peak value VB.

Figure 4:
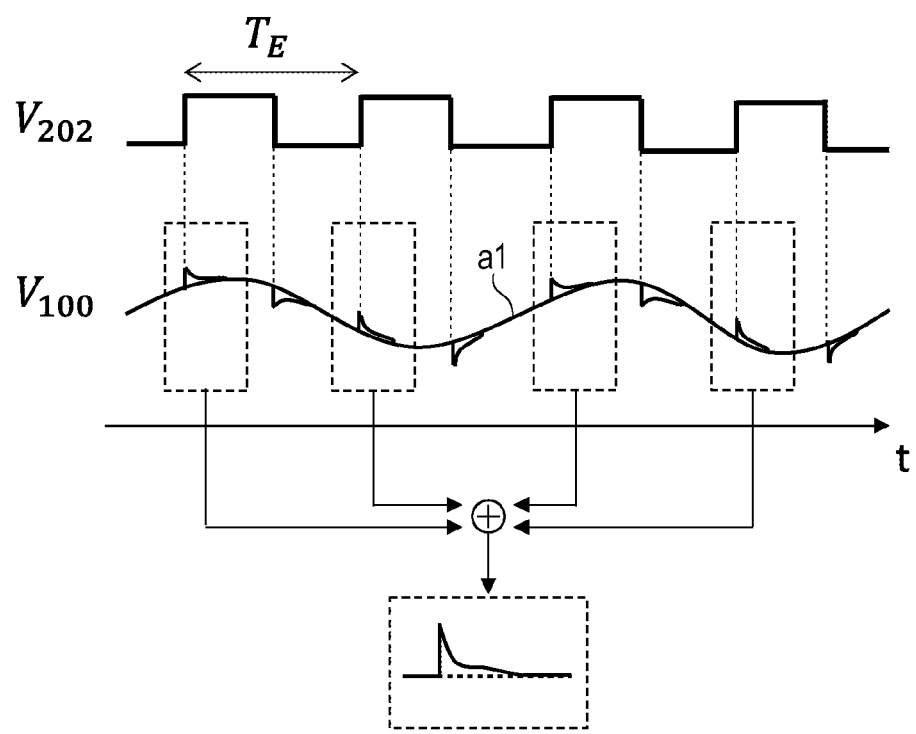
FIG. 4 is a diagram for describing a method of synthesizing waveforms when a capacitance measurement is taken in a case where an electric field signal from a commercial power supply is present.

To avoid this, because an electric field signal frequency is known as 50 Hz or 60 Hz in measurement of an electric field caused by a commercial power supply, it is preferable that the electric field measuring device measure the step response at a frequency integral times the electric field signal frequency (commercial power supply frequency), as shown in FIG. 4. Through this process, the electric field measuring device averages response waveforms (averaging process), thus being able to cancel electric field signal waveforms each other and strengthen step response waveforms each other.

<Actual Operation of Calculating Amplitude Compensation Factor k>

The compensation factor calculation unit 233 operates in the following manner to calculate the amplitude compensation factor k. The compensation factor calculation unit 233 transmits a trigger signal 238 to the GPIO 234 at predetermined timing, thereby applying (inputting) the step wave shown as V203 of FIG. 3 to between the output end of the series resistance 210 and the input end of the amplifier 220 via the attenuator 250 and the reference capacitive element 230.

As a result, the voltage signal 100S created by superposing a step response on the voltage signal 100 is input to the amplifier 220. The voltage signal 201S (step response signal 201S), which is the resulting output from the amplifier 220, travels through a signal line to enter the microcomputer MC1. This step response signal 201S includes a waveform indicating a step response output from the amplifier 220 (hereinafter, "step response waveform"), which is shown as V201 in FIG. 3.

The microcomputer MC1 converts the step response signal 201S as an analog signal into a digital signal by the AD converter 231 built in the microcomputer MC1, and inputs the converted digital signal to the compensation factor calculation unit 233.

The compensation factor calculation unit 233 obtains a step response waveform from the step response signal 201DS, which is the converted digital signal output from the AD converter 231. Based on the step response waveform, the compensation factor calculation unit 233 calculates the amplitude compensation factor k by the method described above.

<Specific Operation of Microcomputer>

The above process of calculating the amplitude compensation factor k is entirely carried out by the compensation factor calculation unit 233 and is executed as a program of the microcomputer MC1. The microcomputer MC1 executes a routine shown in a flowchart of FIG. 5.

Figure 5:
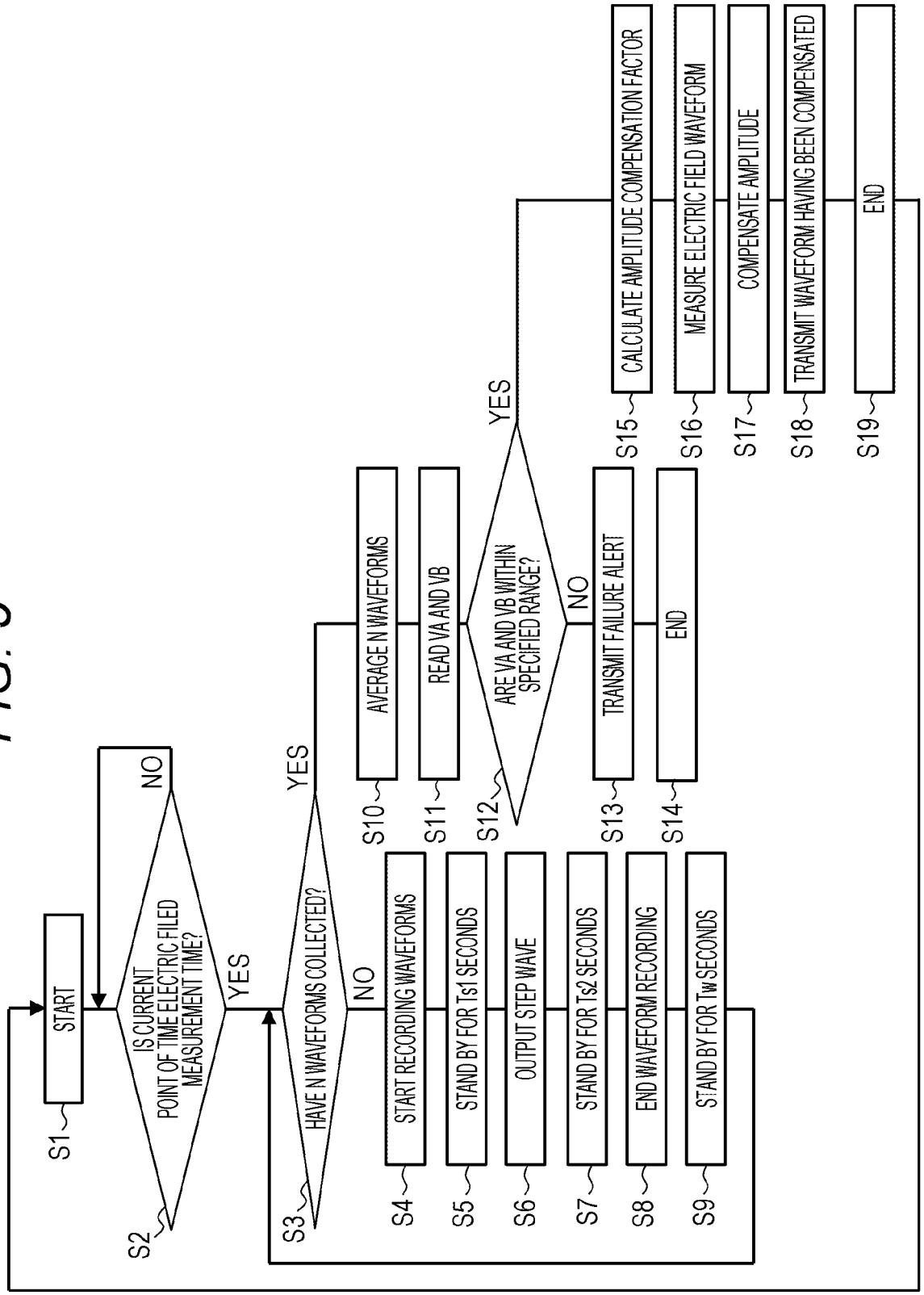
FIG. 5 is a flowchart for describing processes executed by a microcomputer.

The electric field measuring device stands by to be ready for electric field measurement until a given time or event arrives or occurs. Therefore, the microcomputer MC1 having started the process at step S1 and proceeded to step S2 determines whether the current point of time is an electric field measurement time, as shown in FIG. 5.

When the current point of time is not the electric field measurement time, the microcomputer MC1 makes a "No" determination at step S2 and executes step S2 again.

When the current point of time is the electric field measurement time, the microcomputer MC1 makes a "Yes" determination at step S2 and proceeds to step S3. At step S3, the microcomputer MC1 determines whether it has collected N step response waveforms 236. In other words, the microcomputer MC1 determines whether the number of step response waveforms 236 collected by processes at steps S4 to S9, which will be described later, is N (N or more).

When the microcomputer MC1 has not collected N step response waveforms 236 yet, the microcomputer MC1 makes a "No" determination at step S3, and sequentially executes steps S4 to S9 described below.

Step S4: The microcomputer MC1 starts recording the step response waveforms 236.

Step S5: The microcomputer MC1 stands by for Ts1 seconds.

Step S6: The microcomputer MC1 outputs a step wave from the GPIO 234.

Step S7: The microcomputer MC1 stands by for Ts2 seconds.

Step S8: The microcomputer MC1 finishes recording the step response waveforms 236.

Step S9: The microcomputer MC1 stands by for Tw seconds until the start of step response waveform recording.

Step S3 to step S9 are processes of collecting N step response waveforms of V201. These processes are executed to carry out the above averaging process when N is equal to and larger than 2. When the averaging process is not carried out, these processes may be executed with N=1 being set.

When the microcomputer MC1 has collected N step response waveforms 236 at step S3 as a result of execution of steps S3 to S9, the microcomputer MC1 makes a "Yes" determination at step S3, and proceeds to step S10. In the above processes, a step response waveform measurement interval is a total time equal to a total of Ts1, Ts2, and Tw. In this example, this total time is determined to be one over integer of the period of the voltage signal. Therefore, by the averaging process (step S10) to follow, waveforms of the voltage signal can be canceled each other and step response waveforms of the same can be strengthened each other.

At step S10, the microcomputer MC1 carries out the averaging process on the voltage signal including N step response waveforms. Subsequently, the microcomputer MC1 proceeds to step S11, and reads the first peak value VA and the second peak value VB from the step response waveform having been subjected to the averaging process. Reading the first peak value VA through the above-described extrapolation process is carried out at step S11.

Subsequently, the microcomputer MC1 proceeds to step S12, and determines whether the first peak value VA and the second peak value VB are each within a specified range.

When finding that at least either the first peak value VA or the second peak value VB is out of the specified range, the microcomputer MC1 determines that the electric field measuring device is in a state of failure. This determination is made for the following reason. Because the values of the first peak value VA and the second peak value VB are determined by the values of C222 and C1, at least either the first peak value VA or the second peak value VB being out of the design-based value range in which they are expected to stay means a possibility that C222 and/or C1 (e.g., the electric field antenna 1 and/or the amplifier 220) have any problem.

Therefore, when at least either the first peak value VA or the second peak value VB is out of the specified range, the microcomputer MC1 makes a "No" determination at step S12, and proceeds to step S13.

At step S13, the microcomputer MC1 carries out a process of sending a failure alert signal to a device administrator through the wireless device 3, and then proceeds to step 14, at which the microcomputer MC1 ends its operation.

At step S12, when the first peak value VA and the second peak value VB are both within the specified range, the microcomputer MC1 makes a "Yes" determination and then sequentially executes steps S15 to S19 described below.

Step S15: The microcomputer MC1 calculates the amplitude compensation factor k by the method described above.

Step S16: The microcomputer MC1 measures the waveform of the voltage signal 201D (electric field signal).

Step S17: The microcomputer MC1 carries out calculations of compensating the amplitude of the voltage signal 201D (electric field signal), using the amplitude compensation factor k.

Step S18: The microcomputer MC1 transmits the digital signal 237 (electric field signal waveform) having been subjected to amplitude compensation, through the wireless device 3.

Step S19: The microcomputer MC1 ends its operation.

The electric field measuring device according to the first embodiment of the present invention carries out a calibration process (including step S3 to step S15) of calculating the amplitude compensation factor k. In this embodiment, at every execution of the routine of FIG. 5, the electric field measuring device carries out the calibration process before carrying out step S16 and other steps to follow (the process of electric field measurement). The electric field measuring device, however, does not need to carry out the calibration process at every execution of the routine of FIG. 5. The electric field measuring device executes the latter part of the routine of FIG. 5 after calculating the amplitude compensation factor k by executing the former part of the routine of FIG. 5. The electric field measuring device, however, may execute a routine created by omitting steps S3 to S15 from the routine of FIG. 5.

The calibration process (including step S3 to step S15) is executed to compensate the influence of variations in the values of C222 and C1. Therefore, it is desirable from the viewpoint of power consumption and processing time, that the frequency of calibration processes be changed properly, depending on the frequency of electric field measurements and the installation environment of the electric field measuring device. For example, in a case where electric field measurement is carried out every second, the calibration process needs not to be carried out at every electric field measurement and may be carried out every hour. In the case of omitting the calibration process, the microcomputer MC1 omits steps S3 to S15, that is, execute step S16 right after step S2.

<Effects>

As described above, even when the parasitic capacitive element 222, which is an unknown element, is present in the reading circuit 2 of the electric field antenna 1, the electric field measuring device according to the first embodiment compensates the attenuation in amplitude of the electric field signal caused by the parasitic capacitive element 222, thus improving the precision of electric field measurement. According to the electric field measuring device, by using the microcomputer MC1, the attenuation in amplitude of the electric field signal caused by the parasitic capacitive element 222 is compensated by a simple configuration not involving use of an expensive component. The electric field measuring device thus improves the precision of electric field measurement and reduces costs as well.

Second Embodiment

<Configuration>

Figure 6:
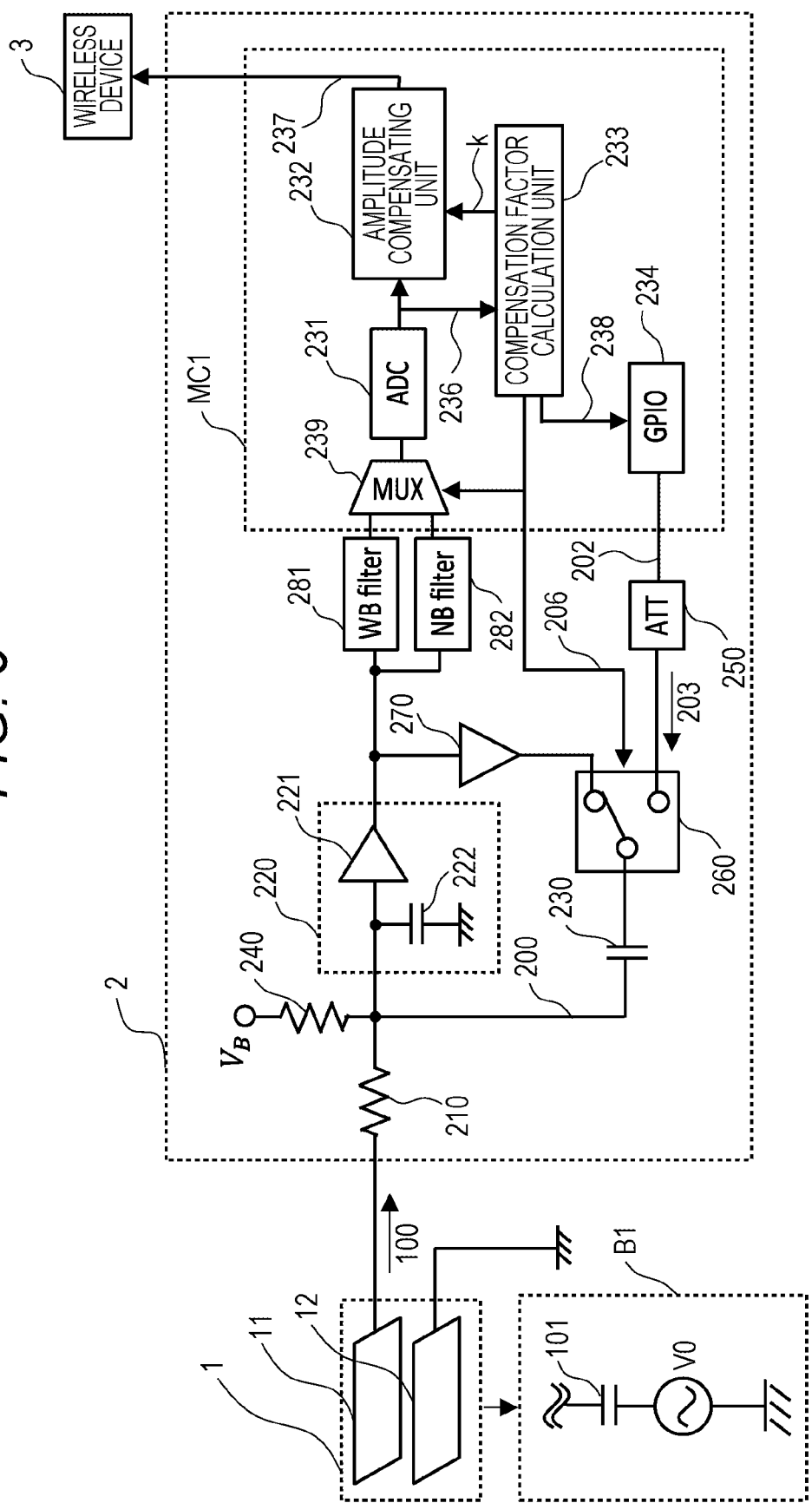
FIG. 6 is a schematic configuration diagram of an electric field measuring device according to a second embodiment of the present invention.

An electric field measuring device according to a second embodiment of the present invention will be described. As shown in FIG. 6, the electric field measuring device according to the second embodiment includes an analog switch 260, a feedback amplifier 270, two types of anti-aliasing filters 281 and 282 having different bandwidths, and a multiplexer 239, in addition to the components of the electric field measuring device according to the first embodiment. Except for this feature, the electric field measuring device of the second embodiment is identical in configuration with the electric field measuring device of the first embodiment shown in FIG. 1.

The analog switch 260 switches (sets) a state of connection between the attenuator 250, the feedback amplifier 270, and the reference capacitive element 230, to either a first connection state or a second connection state according to an instruction from the microcomputer MC1.

The first connection state is a state in which an output end of the feedback amplifier 270 is connected to an input end of the reference capacitive element 230. The second connection state is a state in which an output end of the attenuator 250 is connected to the input end of the reference capacitive element 230.

The feedback amplifier 270 is provided on a feedback path between an output end of the amplifier 220 and an input end of the amplifier 220.

The anti-aliasing filter 281 (hereinafter, "first filter 281") is an anti-aliasing filter having a wide filtering band and an upper limit cutoff frequency set to a predetermined first frequency. The anti-aliasing filter 282 (hereinafter, "second filter 282") is an anti-aliasing filter having a filtering band narrower than the filtering band of the first filter 281 and an upper limit cutoff frequency set to a second frequency lower than the predetermined first frequency.

The multiplexer 239 is a signal switching unit that based on an instruction from the microcomputer MC1, outputs either an incoming signal from the first filter 281 or an incoming signal from the second filter 282, to the AD converter 231.

<Overview>

In the electric field measuring device, the reference capacitive element 230 has no role to play during normal electric field measurement except for step response measurement, and just works as a capacitive element that attenuates a signal applied to the amplifier input 200. It is desirable, for this reason, that at the time of normal electric field measurement, the presence of the reference capacitive element 230 be eliminated from the electric field measuring device in order to make electric field measurement with a better SN ratio.

Therefore, at the time of normal electric field measurement, the electric field measuring device connects the reference capacitive element 230 to the feedback amplifier 270 by a switching signal 206 and the analog switch 260, thus causing the feedback amplifier 270 to operate as a buffer with an amplification factor of 1. The electric field measuring device is thus able to render the capacitance value of the reference capacitive element 230 equivalently zero, the capacitance value being seen from the amplifier input 200.

In general, when the amplification factor of the feedback amplifier 270 is G, a relationship between the voltage V0 and the voltage V100 of the voltage signal 100 is expressed by formula (7) in FIG. 7.

In this embodiment, the amplification factor G of the feedback amplifier 270 is 1. When G is 1, C230 has no influence on the amplitude. G may be set larger than 1. Setting G greater than 1 allows equivalently creating a negative capacitance.

Now, expressing formula (7) of FIG. 7 in terms of the first peak value VA and the second peak value VB, using formulae (2) and (4) of FIG. 2, yields formula (8) of FIG. 7. In this case, the amplitude compensation factor k is the reciprocal of the coefficient of V0 on the right side of formula (8), being given as formula (9) in FIG. 7.

To make electric field measurement with a better SN ratio, it is desirable to narrow down the frequency band of an electric field to be measured to a signal frequency band. For step response measurement, however, the AD converter 231 needs to obtain a signal with a broad frequency band.

To deal with this problem, the electric field measuring device uses the second filter 282 with a narrow filtering band at the time of electric field measurement, while uses the first filter 281 with a wide filtering band at the time of step response measurement. This allows the electric field measuring device to implement electric field measurement with a better SN ratio while executing step response measurement.

In addition, the electric field measuring device lowers the sampling frequency of the AD converter 231, for example, sets the sampling frequency to a first sampling frequency (first sampling period) at the time of electric field measurement, while raises the sampling frequency to one higher than the sampling frequency for electric field measurement, for example, sets the sampling frequency to a second sampling frequency higher than the first sampling frequency (a second sampling period shorter than the first sampling period) at the time of step response measurement. In this manner, by dynamically changing the sampling frequency of the AD converter 231 as necessary, the electric field measuring device suppresses power consumption of the microcomputer MC1.

<Specific Operation of Microcomputer>

Figure 8:
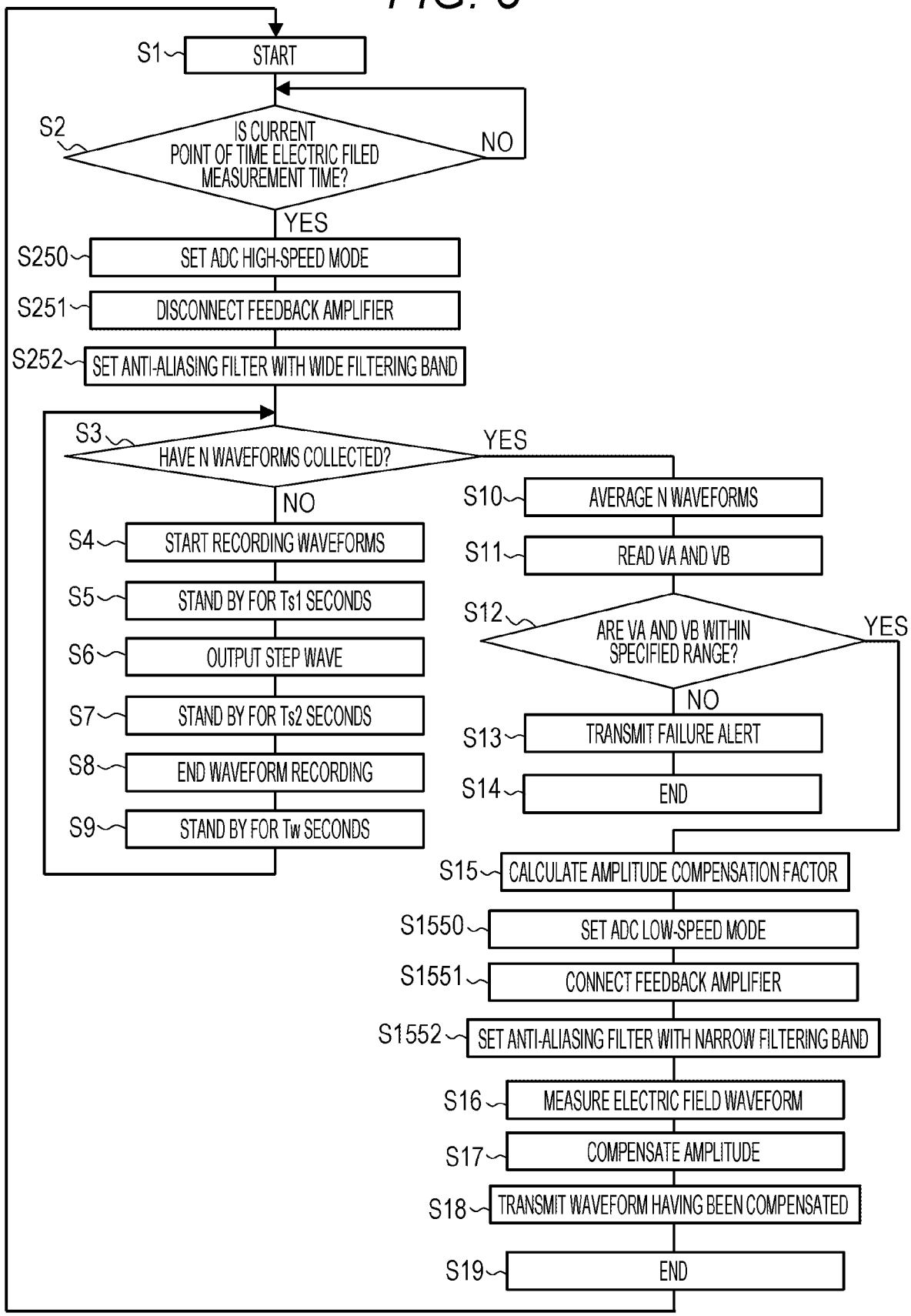
FIG. 8 is a flowchart for explaining processes executed by the microcomputer.

The microcomputer MC1 executes a routine shown in a flowchart of FIG. 8.

This flowchart is different from the flowchart of FIG. 5 in the following respects.

Steps S250 to S252 are added between step S2 and step S3 of FIG. 5.

Steps S1550 to S1552 are added between steps S15 and S16 of FIG. 5.

These differences will hereinafter be described in detail.

Step S250: The microcomputer MC1 sets the AD converter 231 to a high-speed mode. Specifically, the microcomputer MC1 sets the sampling frequency of the AD converter 231 to the second sampling frequency.

Step S251: The microcomputer MC1 switches the state of connection of the analog switch to the second connection state, thereby disconnecting the feedback amplifier 270 from the reference capacitive element 230.

Step S252: The microcomputer MC1 causes a signal from the first filter 281 with a wide filtering band to travel through the multiplexer 239 to the AD converter 231.

Step S1550: The microcomputer MC1 sets the AD converter 231 to a low-speed mode. Specifically, the microcomputer MC1 sets the sampling frequency of the AD converter 231 to the first sampling frequency smaller than the second sampling frequency.

Step S1551: The microcomputer MC1 switches the state of connection of the analog switch 260 to the first connection state, thereby connecting the feedback amplifier 270 to the reference capacitive element 230.

Step S1552: The microcomputer MC1 causes a signal from the second filter 282 with a narrow filtering band to travel through the multiplexer 239 to the AD converter 231.

<Effects>

As described above, the electric field measuring device according to the second embodiment implements electric field measurement with a better SN ratio while executing step response measurement. In addition, by dynamically changing the sampling frequency of the AD converter 231 as necessary, the electric field measuring device suppresses power consumption of the microcomputer MC1.

<<Modifications>>

The present invention is not limited to the above embodiments, and may be implemented as various modifications within the scope of the present invention. For example, in the second embodiment, the feedback amplifier 270 may be omitted. Features of the above embodiments may be combined with each other, providing that such combinations do not depart from the scope of the present invention.

What is claimed is:

1. An electric field measuring device comprising:
   an electric field detection unit that includes two electrodes and generates a voltage signal because of an electric field;
   an amplifier that receives input of the voltage signal via a series resistance, and buffers or amplifies the voltage signal to output the voltage signal;
   a reference capacitive element that has a reference capacitance, and has an output end connected between an output end of the series resistance and an input end of the amplifier;
   a step wave generating unit that is connected to an input end of the reference capacitive element, and generates a step wave;

an analog-to-digital conversion unit that receives input of the voltage signal output from the amplifier, and converts the input voltage signal into a digital signal at a predetermined sampling period; and an information processing unit that processes the voltage signal that has been converted into the digital signal by the analog-to-digital conversion unit, wherein the information processing unit, using the step wave generating unit, inputs the step wave to the amplifier through between the output end of the series resistance and the input end of the amplifier, via the reference capacitive element, and obtains a step response waveform that is a waveform indicating a step response of output from the amplifier when the step wave is input to the amplifier, calculates, based on the step response waveform, an amplitude compensation factor derived based on a relationship between an inter-electrode voltage between the two electrodes that arises because of the electric field, and a voltage indicated by the voltage signal, the reference capacitance, an input capacitance that is a parasitic capacitive element of the amplifier, and an inter-electrode capacitance that is a capacitance between the electrodes, and compensates the voltage signal output from the amplifier, using the amplitude compensation factor, and obtains the compensated voltage signal, as the electric field corresponding to the inter-electrode voltage.

2. The electric field measuring device according to claim 1, wherein the information processing unit, based on the step response waveform, obtains a first peak value indicating a wave height of a voltage at the input end of the amplifier at a point of time of inputting the step wave when the step wave is input to the amplifier, and a second peak value indicating a wave height of the voltage at the input end of the amplifier when the voltage reaches a steady state, and calculates the amplitude compensation factor by dividing the first peak value by a difference given by subtracting the second peak value from the first peak value.

3. The electric field measuring device according to claim 1, wherein the step wave generating unit outputs the step wave at a frequency integer times a frequency of a commercial power supply.

4. The electric field measuring device according to claim 1, wherein the series resistance is set so that a product of a resistance value of the series resistance and the inter-electrode capacitance is larger than the predetermined sampling period.

5. The electric field measuring device according to claim 1, wherein the reference capacitive element is provided on a feedback path between an output end of the amplifier and the input end of the amplifier, the electric field measuring device further comprises a switch that switches a state of connection between the reference capacitive element, the amplifier, and the step wave generating unit, to either a first connection state in which an input end of the reference capacitive element is connected to the output end of the amplifier or a second connection state in which an output end of the step wave generating unit is connected to the input end of the reference capacitive element, and the information processing unit sets a connection state of the switch to the first connection state when the step response waveform is not obtained, and sets the connection state of the switch to the second connection state when the step response waveform is obtained.

6. The electric field measuring device according to claim 5, wherein on the feedback path, a feedback amplifier having a predetermined amplification factor is provided between the output end of the amplifier and the input end of the reference capacitive element, and the information processing unit, based on the step response waveform, obtains a first peak value indicating a wave height of a voltage at the input end of the amplifier at a point of time of inputting the step wave when the step wave is input to the amplifier, and a second peak value indicating a wave height of the voltage at the input end of the amplifier when the voltage reaches a steady state, and calculates the amplitude compensation factor by applying the first peak value and the second peak value to a relation formula expressing a relationship between the amplitude compensation factor, the first peak value, the second peak value, an amplitude of the step wave, and the amplification factor.

7. The electric field measuring device according to claim 5, comprising:

a first anti-aliasing filter and a second anti-aliasing filter that are disposed at a preceding stage of the analog-to-digital conversion unit; and a signal switching unit that outputs either an incoming signal from the first anti-aliasing filter or an incoming signal from the second anti-aliasing filter, to the analog-to-digital conversion unit, wherein an upper limit cutoff frequency of the first anti-aliasing filter is set higher than an upper limit cutoff frequency of the second anti-aliasing filter, and the information processing unit, sets the signal switching unit to output the incoming signal from the first anti-aliasing filter to the analog-to-digital conversion unit when the step response waveform is obtained, and sets the signal switching unit to output the incoming signal from the second anti-aliasing filter to the analog-to-digital conversion unit when the step response waveform is not obtained.

8. The electric field measuring device according to claim 5, wherein the information processing unit sets the analog-to-digital conversion unit to set the predetermined sampling period to a first sampling period when the step response waveform is not obtained, and sets the analog-to-digital conversion unit to set the predetermined sampling period to a second sampling period shorter than first sampling period when the step response waveform is obtained.

9. The electric field measuring device according to claim 1, comprising a wireless device that transmits the voltage signal having been compensated to outside, wherein the information processing unit transmits the voltage signal having been compensated to the outside through the wireless device.

10. An electric field measuring method comprising:

causing an electric field detection unit that includes two electrodes to generate a voltage signal because of an electric field;

inputting the voltage signal to an amplifier via a series resistance and causing the amplifier to buffer or amplify the voltage signal to output the voltage signal;

causing a step wave generating unit to generate a step wave, the step wave generating unit being connected to an input end of a reference capacitive element that has a reference capacitance and has an output end connected between an output end of the series resistance and an input end of the amplifier;

converting the voltage signal output from the amplifier, into a digital signal at a predetermined sampling period; and processing the voltage signal that has been converted into the digital signal, the method further including:

inputting the step wave to the amplifier through between the output end of the series resistance and the input end of the amplifier, via the reference capacitive element;

obtaining a step response waveform that is a waveform indicating a step response of output from the amplifier when the step wave is input to the amplifier;

calculating, based on the step response waveform, an amplitude compensation factor derived based on a relationship between an inter-electrode voltage between the two electrodes that arises because of the electric field, and a voltage indicated by the voltage signal, the reference capacitance, an input capacitance that is a parasitic capacitive element of the amplifier, and an inter-electrode capacitance that is a capacitance between the electrodes; and compensating the voltage signal output from the amplifier, using the amplitude compensation factor, and obtaining the compensated voltage signal, as the electric field corresponding to the inter-electrode voltage.

* * * * *